(12) United States Patent
Andersen

(10) Patent No.: US 11,875,623 B2
(45) Date of Patent: Jan. 16, 2024

(54) LATCH FITTING

(71) Applicant: Jesper Birk Andersen, Hong Kong (CN)

(72) Inventor: Jesper Birk Andersen, Hong Kong (CN)

( * ) Notice: Subject to any disclaimer, the term of this patent is extended or adjusted under 35 U.S.C. 154(b) by 379 days.

(21) Appl. No.: 17/332,158

(22) Filed: May 27, 2021

(65) Prior Publication Data

US 2021/0407235 A1 Dec. 30, 2021

(30) Foreign Application Priority Data

Jun. 24, 2020 (GB) .................................... 2009634

(51) Int. Cl.
*G07C 9/00* (2020.01)
*G01R 31/382* (2019.01)
(Continued)

(52) U.S. Cl.
CPC ....... *G07C 9/00896* (2013.01); *G01R 31/382* (2019.01); *G01S 19/01* (2013.01);
(Continued)

(58) Field of Classification Search
CPC .................. E05B 47/00; E05B 47/0012; E05B 2047/0084; E05B 65/00; E05B 65/0014;
(Continued)

(56) References Cited

U.S. PATENT DOCUMENTS

| 7,102,329 B2 * | 9/2006 | Soyer | G01R 31/3648 |
| | | | 320/128 |
| 2017/0084103 A1 * | 3/2017 | Ribbe | E05F 15/75 |

(Continued)

FOREIGN PATENT DOCUMENTS

| CN | 203515010 U | 4/2014 |
| CN | 204444900 U | 7/2015 |

(Continued)

OTHER PUBLICATIONS

Great Britain Search Report for Application No. GB2009634.3 dated Oct. 14, 2020 2 pages.

*Primary Examiner* — Nathan Cumar
(74) *Attorney, Agent, or Firm* — Lippes Mathias LLP

(57) ABSTRACT

The invention relates to a child safety locking mechanism 1 for a cupboard or drawer 2 comprising at least one movable door or drawer 3 and a fixed frame 2, and the locking mechanism 1 comprising: a latch assembly 5 and a catch part 4 each fitted on the movable door or drawer 3 and fixed frame, the latch assembly 5 including a latching arm 8 and a latching hook 9, and the catch part including a catch arm 6. The latching hook 9 is aligned to abut against the catch arm 6 in a locked position to prevent the movable door from being fully opened, wherein the latching arm is movable to an unlocked position in which the latching hook 9 is no longer aligned to abut against the catch arm 6 and the movable door or drawer 3 may be opened. Motor driven automatic release means are provided which are remotely actuatable to automatically move the latching arm 8 to the unlocked position when the automatic release means are actuated by a user. The latching arm 8 is moved downwards automatically by the remote actuation of the release arm 20 out of alignment with the catch arm 6. The release arm 20 is mounted on an axle which is rotated by a motor to just a sufficient extent to act on the latch arm 8 to move it out of alignment with the catch arm 6. The latch assembly 5 includes control means for the motor in the form of a circuit board, which also includes a Bluetooth or other radio wave receiver, located in a latch assembly casing 22.

19 Claims, 7 Drawing Sheets

(51) Int. Cl.
*G01S 19/01* (2010.01)
*E05B 47/00* (2006.01)
*E05B 65/00* (2006.01)

(52) U.S. Cl.
CPC ...... *G07C 9/00309* (2013.01); *E05B 47/0012* (2013.01); *E05B 65/0014* (2013.01); *E05B 2047/0084* (2013.01)

(58) Field of Classification Search
CPC ....... E05B 13/00; G07C 9/00; G07C 9/00896; G07C 9/00309; G01R 31/00; G01R 31/382; G01R 31/3828; G01R 31/3832; G01R 31/3833; G01S 19/00; G01S 19/01
USPC ....................................................... 70/283.1
See application file for complete search history.

(56) References Cited

U.S. PATENT DOCUMENTS

2018/0363328 A1    12/2018  Huang
2020/0043271 A1*  2/2020  Anderson .......... G07C 9/00309

FOREIGN PATENT DOCUMENTS

| CN | 204899499 U | 12/2015 |
| CN | 105257119 A | 1/2016 |
| GB | 2173850 A | 10/1986 |

* cited by examiner

LATCH FITTING

CROSS-REFERENCE TO RELATED APPLICATIONS

This application claims priority under 35 U.S.C. § 119, and the benefit of Great Britain Patent Application No. 2009634.3, filed Jun. 24, 2020 and titled "Latch Fitting", the entirety of which application is hereby incorporated by reference as is fully set forth herein.

The present invention relates to a latch for cupboards, cabinet doors and the like, and, more particularly, "childproof" latches that include features which make them difficult to be actuated by small children.

BACKGROUND OF THE INVENTION

Cupboards are commonly used in daily life in kitchens, bedrooms, offices, etc. to store a wide range of articles, some of which may be harmful to children. Small children may also attempt to climb on, or even in, cupboards and cabinets in an effort to hide. Cupboards and cabinets may house many types of materials which may be potentially hazardous to children such as medicines, household cleaners, knives, tools, paint, etc.

To prevent young children from accessing these storage areas, numerous items have been patented and sold, most of a multi-piece assembly. Generally, some sort of a longitudinal member with a hook portion is attached to either side surface of a cupboard or cupboard handle to limit the amount the cupboard door may be opened. The hook portion may engage with the cupboard handles or fixings on the cupboard doors. A latch on the hook may be depressed to release the hook from the cupboard handles or fixings on the cupboard doors.

While the disengagement of the latch is relatively easy for an adult, the latches are intended to be difficult to manipulate by a child. However, since the actuation may be easily learned by an attentive child, the latch may soon prove inadequate.

In some cases, these hooks require at least two components, which need alignment during installation or adjustment after installation. These components generally include protrusions fixed to the cupboard door for the hook to latch around. This mechanism may further require a biasing member (springs, etc.) to bias the latch member against the hook member.

These hooks allow a certain amount of operability of the cupboard doors allowing their partial opening due the playability of the material used or a looseness of the fixing.

These locks can be problematic in that in making the lock difficult for children to open they are also difficult for adults who are not familiar with the operation of the lock. It is often the case that parents will leave their children with a nanny or child minder or baby sitter who is not familiar with the operation of the lock but who may wish to access the contents of the cupboard or drawer. Similarly, it has recently become more common for the occupants of a dwelling to change more frequently with the onset of on-line home sharing, so the occupants may be a family with young children for a certain period, who will need the child locks, and for another period the occupants may not include small children and so the child locks are unnecessary and an encumbrance.

What is needed is a "child-proof" safety lock that is easy to install on at least one cupboard door or drawer, and is operable only when needed.

It is thus an object of the present invention to provide a lock according to claim 1.

DESCRIPTION OF THE DRAWINGS

FIG. 6: shows a side view of an unlocking magnet key of the invention.

DETAILED DESCRIPTION

Figure 1:
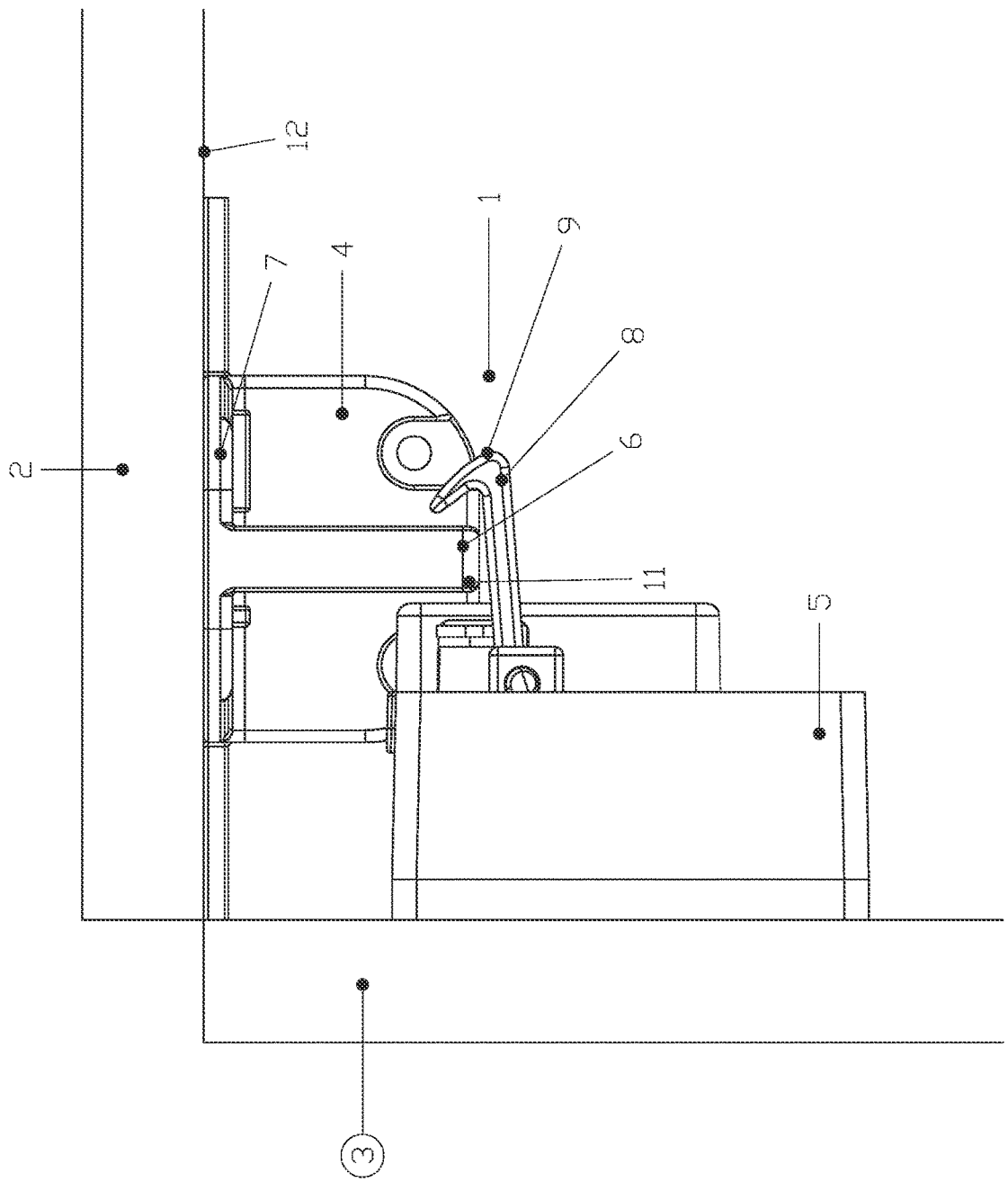
FIG. 1: shows a side view of a first embodiment showing a lock mechanism of the invention while in use in the locked position.
Figure 2:
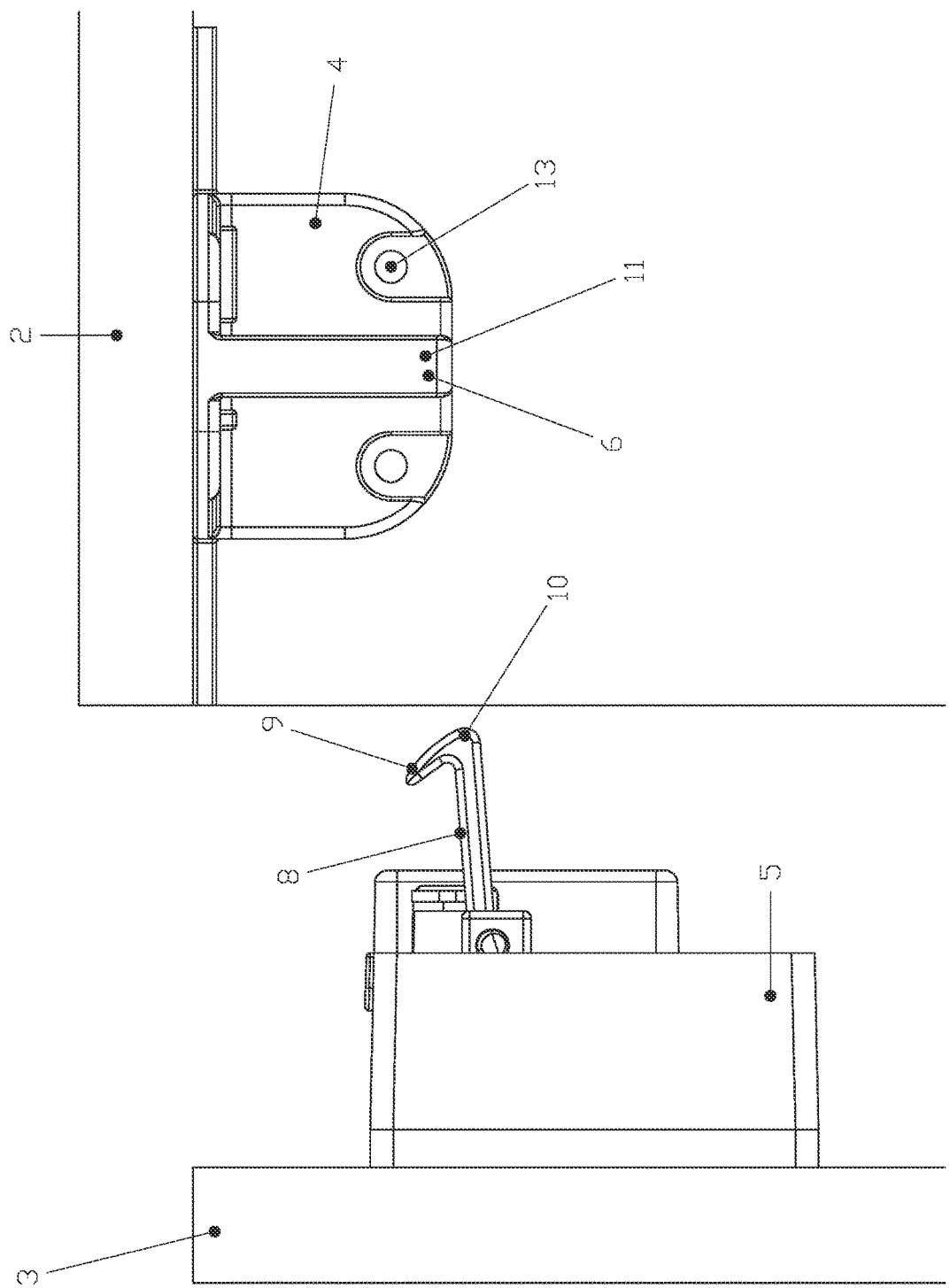
FIG. 2: shows a side view of the first embodiment of the lock mechanism of the invention of FIG. 1, in the unlocked position.
Figure 3:
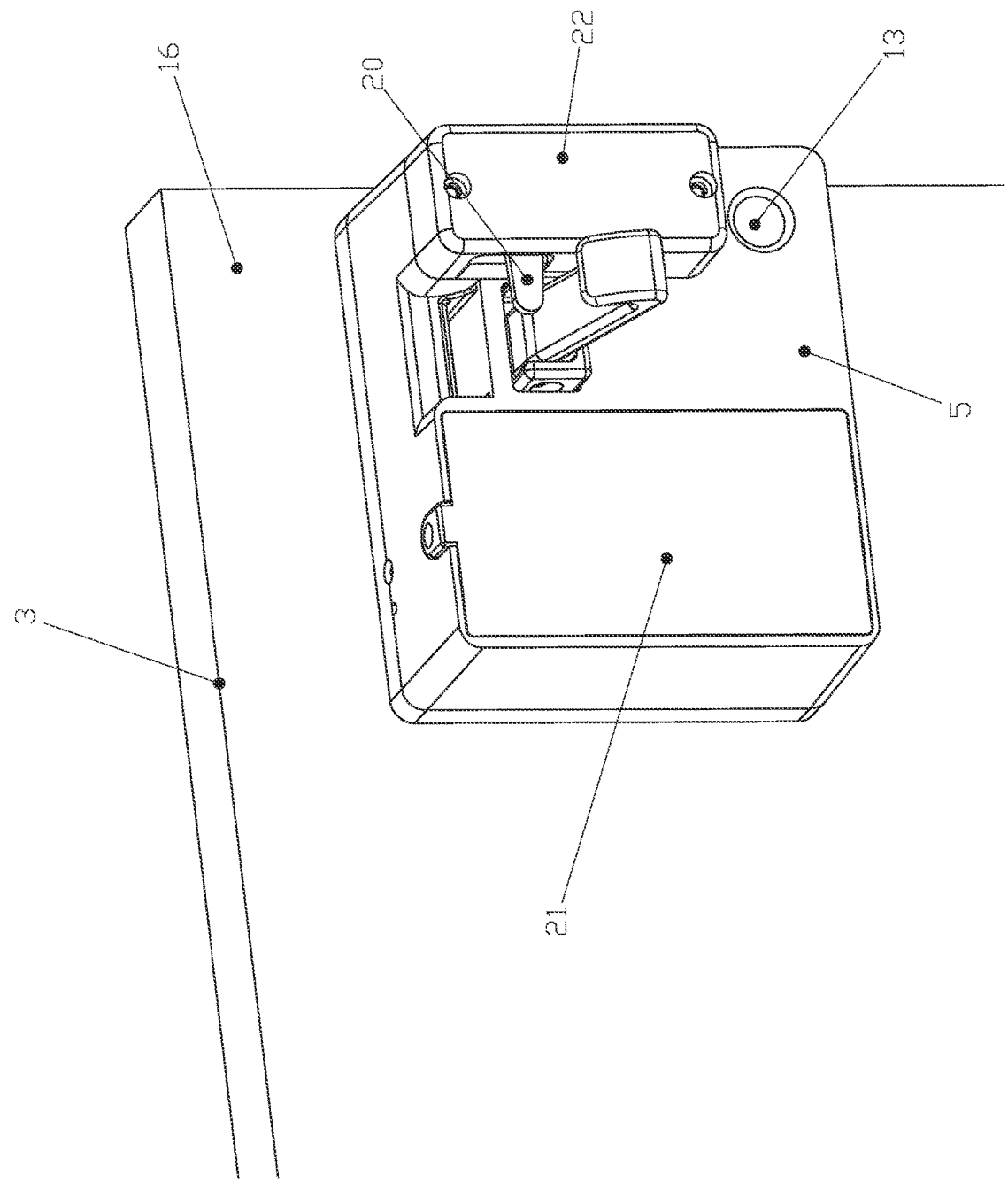
FIG. 3: shows a perspective view of the latch part of the embodiment of FIG. 1, FIG. 4: shows a perspective view of the lock mechanism of FIG. 1 in the unlocked position.
Figure 4:
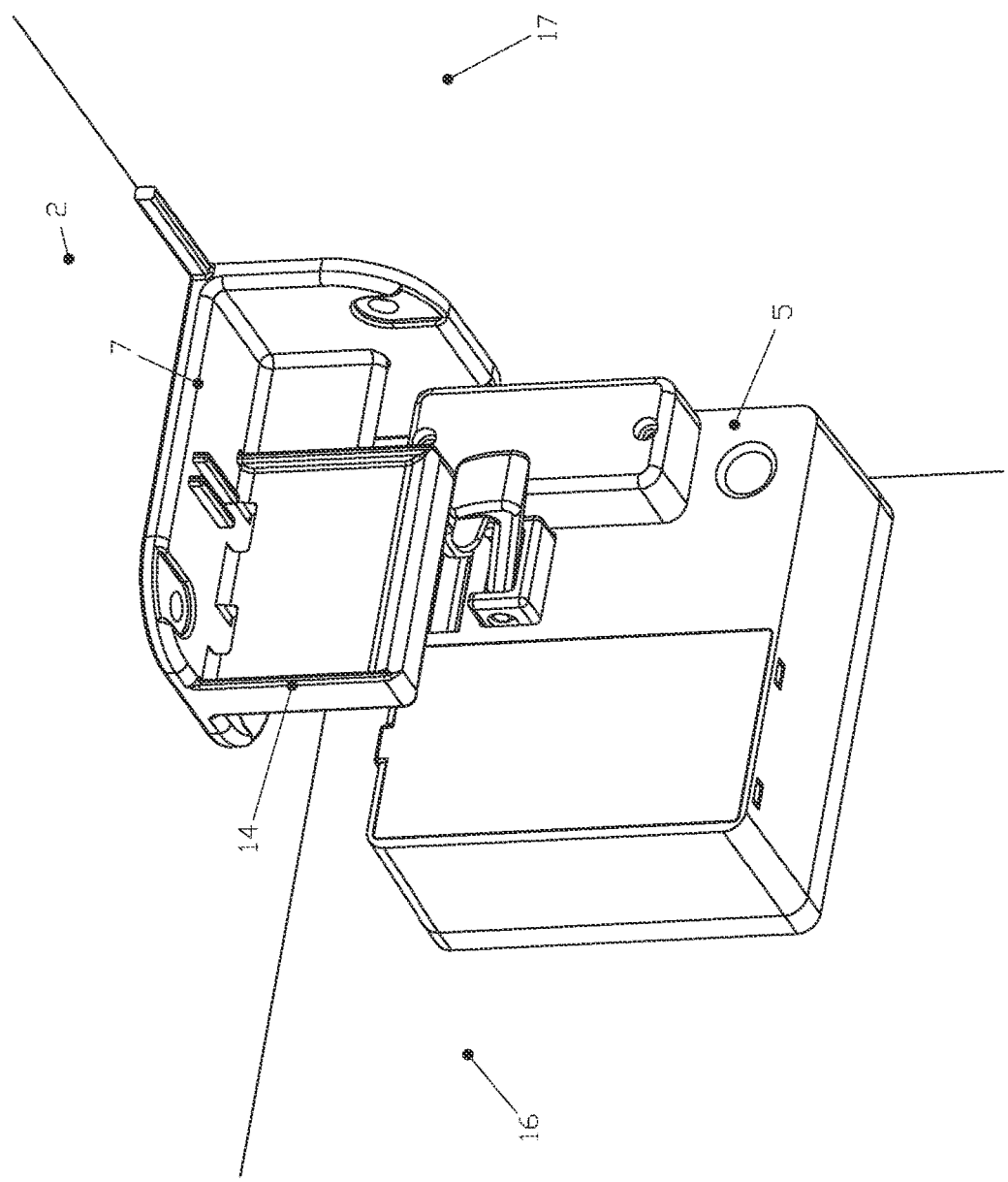
Figure 5:
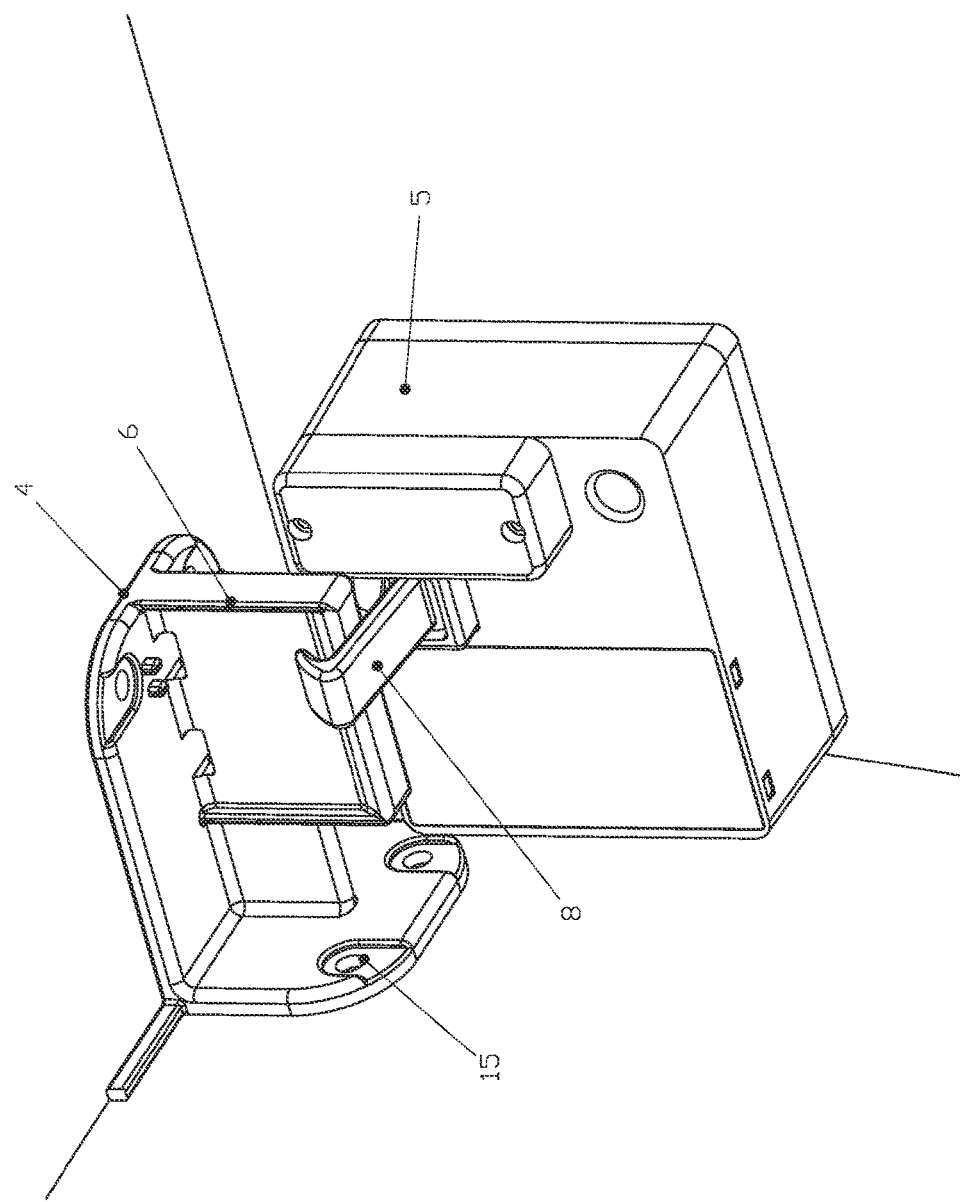
FIG. 5: shows a perspective view of the lock mechanism of FIG. 1 in the locked position.
Figure 10:
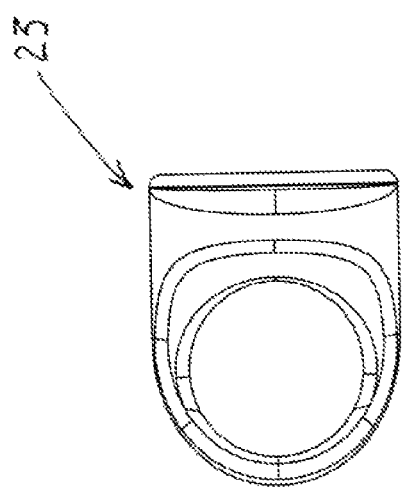

The present invention is described more fully hereinafter with reference to the accompanying drawings, in which preferred embodiments of the invention are shown. This invention, may, however, be embodied in many different forms and should not be construed as limited to the embodiments set forth herein; rather, these embodiments are provided so that this disclosure will be thorough and complete, and will fully convey the scope of the invention to those skilled in the art.

Referring now to FIGS. 1 to 6, a first embodiment of a childproof lock mechanism, according to the present invention, is illustrated in side and perspective views. The lock mechanism 1 includes a catch part 4 arranged, in this embodiment, to fit against the outside surface of the cupboard 2, and a latch assembly 5 arranged to fit on the inside surface of a drawer panel 3. In other embodiments it will be appreciated that the catch part 4 may be arranged on the drawer panel and the latch assembly 5 may be arranged on the cupboard surface, or the drawer panel may be a hinged cupboard door.

The catch part 4 includes a supporting plate 7 for securing the catch part 4 to an internal surface 12 of the cupboard 2, which securing may be effected by adhesive and/or by securing crews through holes 13. A catch arm 6 extends orthogonally from the securing plate 7 and includes a recess 14. In this embodiment the catch part 4 also includes a second orthogonal supporting plate 15 for attachment to an internal surface 16 of an orthogonal cupboard panel 17 to provide additional support for the catch part 4.

The latch assembly 5 includes a latch arm 8 with a latching hook 9 at its remote end. The latching hook 9 is arranged to hook in the recess 14 of the catch arm 6 in a locked position which prevents the cupboard door from being opened by a child. The latch arm 8 is movable downwardly on FIGS. 1 and 7 to a position in which the latching hook 9 is free from the catch arm 6 and the door or drawer 3 may be opened.

The latching arm 8 is naturally urged in the upward position so that after the arm 8 is release it moves back to its original upward position automatically. The hook means 9 has an inclined outside surface 10 so that, as the door or drawer 3 is closed, the outside surface 10 slides against the catch arm end 11 so that the latching hook 9 automatically locks again behind the catch arm 14, each time the door or drawer 3 is closed.

In this embodiment the catch arm 6 also includes a recess 14.

The latch assembly 5 and catch part 4 are fitted to their respective surfaces, with the catch assembly 4 being spaced from the latch assembly 5 at a distance which permits the desired amount of opening of the door or drawer whilst the latch is locked. A spacer device, not shown, can be provided to allow the user to fix the catch assembly at the desired distance.

Alternatively the latching arm 8 may be moved downwards automatically by the remote actuation of the release arm 20. Release arm 20 is mounted on an axle which is rotated by a motor (not shown) to just a sufficient extent to act on the latch arm 8 to move it out of engagement with the catch arm 6. Alternative motor means may be used such as a linear motor which may urge the release arm directly in a linear rather than a rotary direction. Battery means are provided in the battery case 21 to energise the motor and control means in the form of a circuit board, which also includes a Bluetooth or other radio wave receiver, are located in a latch assembly casing 22. Thus the release arm 20 can be set in a downward position which holds the latch arm in the unlocked position and the door or drawer may be freely opened. The Bluetooth receiver may be synchronised and paired with a Bluetooth device such as a smart phone of a user so that the user may deactivate or unlock the child safety lock using the phone in the proximity of the lock. Similarly a relay Bluetooth device, which could be another appliance, or other control means in the dwelling such as central heating control, may be located in the proximity of the lock, and activated by a smart device 18, such as a smart phone from a remote location when the user is no longer in the building.

Figure 7:
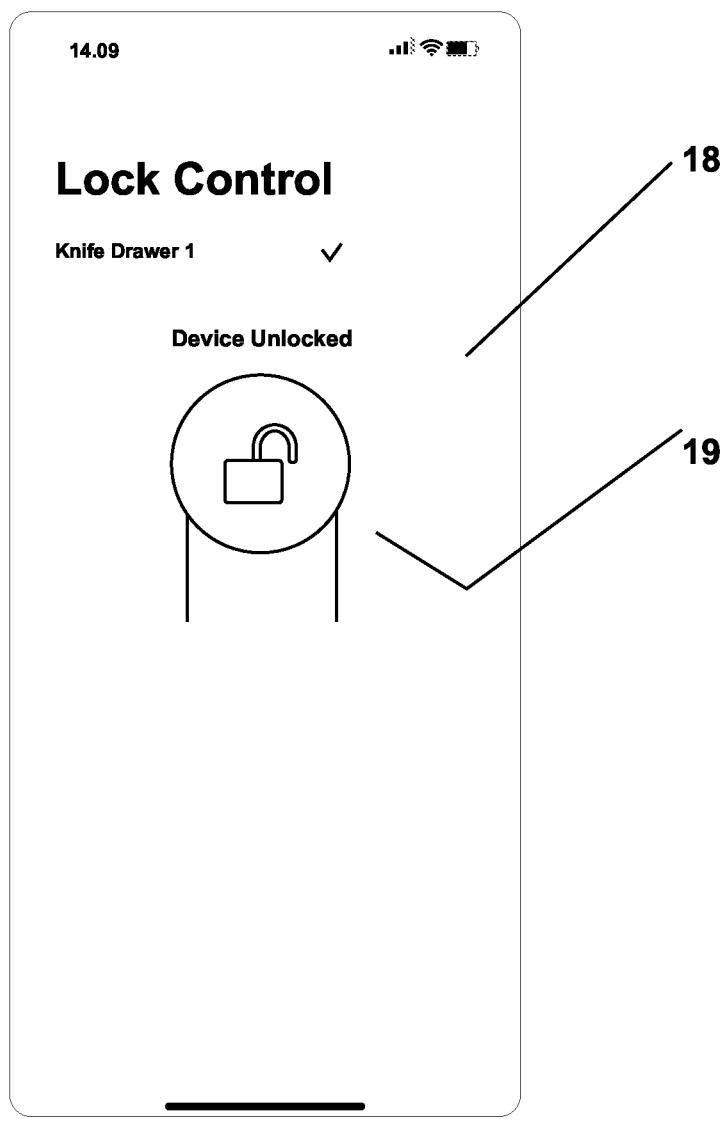
FIG. 7 shows a plan view of an app interface used to operate the lock mechanism of FIG. 1.

A number of locks may be activated or deactivated in this way simultaneously. An app is provided to control the locked and unlocked status of each or all the cupboards or of groups of a number of cupboards that might be in a particular room or location. FIG. 7 shows an example of how an app interface 19 of a smart device 18 may be used to operate the lock or locks.

In another example a user may wish to activate the lock or locks after retiring to bed so that the cupboards are secure from children getting up in the night and being unsupervised.

In addition, the lock may be unlocked by means of a magnet key 23 as shown in FIG. 6. The magnet key 23 includes an unlocking magnet which acts on an arm magnet located in the latch arm 8, not shown, and when the magnet key is located in an unlock position against the cabinet door, on the opposite side of the cabinet door and at a lower level with respect to the latch arm 8, the latch arm 8 is urged downwardly to the open position. In a simpler embodiment it is possible that the latch arm 6 is made of iron or another magnetisable material, which is moved by the unlocking magnet of the magnet key 23. Similarly, the latch arm 8 could include a magnet and the magnet key 23 containing iron or another magnetisable material.

This acts as an over-ride to unlock the cabinet door when access is needed if the device or the bluetooth or radio frequency communication is not available.

In a further embodiment the Bluetooth lock control means is operated automatically according to times pre-set by the user.

In a further embodiment the Bluetooth lock control means is operated automatically depending on the location of the smart device 18 of the user as shown in FIG. 7. The smart device 18 includes location tracking means such as GPS and the app is configured to lock or unlock the locks when the user is in a particular location. For example a user may wish to configure the control means to activate the locks to the locked position when the user has left a room, and to deactivate the locks when the user re-enters the room in the case that the user select that s/he only needs the locks to be active when the user is not present in the room to supervise. Alternatively the user may select the locks to be active when s/he is in the room if s/he is engaged in another activity for example.

Holes are also provided in the latch assembly 5 for attachment to the inside surface of a cupboard with mechanical fasteners, such as small nails or screws. Double-sided adhesive tape or hook-and-loop type fasteners, such as Velcro® may also be used.

The latch assembly also includes a charge measuring means which measure the battery charge level of the battery means. This battery charge level is communicated to the app to provide an indication of the remaining charge to the user. In addition, when the battery is close to being depleted, a fixed depletion level is set after which point the automatic operation of the lock may no longer be used. At this fixed depletion level there is sufficient charge to move the release arm 20 to either the locked or unlocked position. The app is configured to permit the user to select that the release arm 20 is to automatically set to either the unlocked position or the locked position on reaching the fixed depletion level.

It should be understood that although specific embodiments of the present invention have been described herein in detail, such descriptions are for purposes of illustration only and modifications may be made thereto within the scope of the invention.

The description and drawings illustratively set forth the presently preferred invention embodiment. We intend the description and drawings to describe this embodiment and not to limit the scope of the invention. Obviously, it is possible to modify these embodiments while remaining within the scope of the following claims. Therefore, within the scope of the claims one may practice the invention otherwise than as the description and drawings specifically show and describe.

COMPONENT LIST

1. Lock mechanism
2. Cupboard
3. Drawer panel
4. Catch part
5. Latch assembly
6. Catch arm
7. Supporting plate 7
8. Latch arm
9. Latching hook
10. Outside surface
11. Catch arm end
12. Internal surface
13. Holes 13
14. Recess 14
15. Supporting plate 15
16. Internal surface 16
17. Orthogonal cupboard panel 17
18. Smart device
19. App interface 20. Release arm 20.
21. Battery case 21
22. Latch assembly casing
23. Magnet key.

The invention claimed is:

1. A child safety locking mechanism for a cupboard or drawer comprising at least one movable door or drawer and a fixed frame, and the locking mechanism comprising: a latch assembly and a catch part each fitted on the movable door or drawer and fixed frame or vice versa, the latch assembly including a latching arm and a latching hook, and the catch part including a catch arm wherein the latching hook is aligned to abut against the catch arm in a locked position to prevent the movable door from being fully opened by a child, wherein the latching arm is movable to an unlocked position in which the latching hook is no longer aligned to abut against the catch arm and the movable door or drawer may be freely opened; and wherein, when the door is closed, the latching arm automatically moves back to the locked position; and comprising remotely actuatable release means which are remotely actuatable to move the latching arm downward to the unlocked position when the release means are actuated remotely by an adult user, thus disabling the child safety locking mechanism, wherein the remotely actuatable release means comprises a release arm driven by a motor, and wherein the child safety locking mechanism is programmable in advance by a user via an app by time and date.

2. A child safety locking mechanism according to claim 1, wherein the release arm is mounted on an axle which is rotated by a motor to just a sufficient extent to act on the latch arm to move it out of alignment with the catch arm.

3. A child safety locking mechanism according to claim 1, comprising battery means in a battery case to energise the motor.

4. A child safety locking mechanism according to claim 1, wherein the latch assembly includes control means for the motor in the form of a circuit board, which also includes a radio wave receiver, located in a latch assembly casing.

5. A child safety locking system for a mechanism according to claim 4, wherein the radio wave receiver is a Bluetooth radio wave receiver that is synchronised and paired with a Bluetooth device of a user so that the user may deactivate or unlock the child safety lock using the Bluetooth device in the proximity of the lock.

6. A child safety locking system according to claim 5, wherein an intermediate Bluetooth device, is located in the proximity of the lock, and activatable by a smart phone from a remote location.

7. A child safety locking system according to claim 5, wherein a plurality of locks may be activated or deactivated.

8. A child safety locking system according to claim 7, wherein an app is provided to control the locked and unlocked status of each or all of the cupboards or of groups of a number of cupboards that might be in a particular room or location.

9. A child safety locking mechanism for a cupboard or drawer comprising at least one movable door or drawer and a fixed frame, and the locking mechanism comprising: a latch assembly and a catch part each fitted on the movable door or drawer and fixed frame or vice versa, the latch assembly including a latching arm and a latching hook, and the catch part including a catch arm wherein the latching hook is aligned to abut against the catch arm in a locked position to prevent the movable door from being fully opened by a child, wherein the latching arm is movable to an unlocked position in which the latching hook is no longer aligned to abut against the catch arm and the movable door or drawer may be opened; and wherein, when the door is closed, the latching arm automatically moves back to the locked position; and comprising automatic release means which are remotely actuatable to automatically move the latching arm downward to the unlocked position when the automatic release means are actuated by a user;
 wherein in that the automatic remotely actuatable release means comprises a release arm driven by a motor;
 wherein the latch assembly includes control means for the motor in the form of a circuit board, which also includes a radio wave receiver, located in a latch assembly casing;
 wherein the radio wave receiver is a Bluetooth radio wave receiver that is synchronised and paired with a Bluetooth device of a user so that the user may deactivate or unlock the child safety lock using the Bluetooth device in the proximity of the lock;
 wherein a plurality of locks may be activated or deactivated;
 wherein an app is provided to control the locked and unlocked status of each or all of the cupboards or of groups of a number of cupboards that might be in a particular room or location; and
 wherein the app enables the activation of the lock or locks to be programmed in advance by time and date.

10. A child safety locking system according to claim 8, wherein the app enables the activation of the lock or locks to be operated automatically depending on the location of the smart device of the user by means of a location tracking means located in a smart device operated by a user, such as GPS.

11. A child safety locking system according to claim 10, wherein the app enables the activation of the lock or locks to be programmed depending on the location of the smart device of a user.

12. A child safety locking system according to claim 5, wherein:
 the latch assembly includes a charge measuring means which measures the battery charge level of the battery means; and
 the battery charge level means is configured to communicate to the app to provide an indication of the remaining charge to the user.

13. A child safety locking system according to claim 12, wherein when the battery is close to being depleted a fixed depletion level is set after which point the automatic operation of the lock may no longer be used.

14. A child safety locking system according to claim 13, wherein at the fixed depletion level there is sufficient charge to move the release arm to either the locked or unlocked position.

15. A child safety locking system according to claim 14, wherein the app is configured to permit the user to select that the release arm automatically set to either in the unlocked position or the locked position on reaching the fixed depletion level.

16. A child safety locking mechanism according to claim 1, wherein the release arm can be set in a downward position which holds the latch arm in the unlocked position and the door or drawer may be freely opened.

17. A child safety locking mechanism according to claim 1, wherein the lock may be unlocked by means of a magnet key.

18. A child safety locking mechanism according to claim 1, wherein the latch assembly also includes a charge measuring means which measures the battery charge level of the battery means.

19. A child safety locking system according to claim 1, wherein the app enables the child safety locking mechanism is programmable via the app to be disabled when children have gone to bed and adults are sharing the use of the kitchen and enabled again after the adults have gone to bed.

\* \* \* \* \*